(12) United States Patent
Kadasani et al.

(10) Patent No.: US 11,972,114 B2
(45) Date of Patent: Apr. 30, 2024

(54) DYNAMIC BLOCK CATEGORIZATION TO IMPROVE RELIABILITY AND PERFORMANCE IN MEMORY SUB-SYSTEM

(71) Applicant: Micron Technology, Inc., Boise, ID (US)

(72) Inventors: Sandeep Reddy Kadasani, Meridian, ID (US); Pitamber Shukla, Boise, ID (US); Scott Anthony Stoller, Boise, ID (US); Niccolo' Righetti, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/867,204

(22) Filed: Jul. 18, 2022

(65) Prior Publication Data

US 2024/0020020 A1 Jan. 18, 2024

(51) Int. Cl.
*G06F 3/06* (2006.01)

(52) U.S. Cl.
CPC ............ *G06F 3/0619* (2013.01); *G06F 3/064* (2013.01); *G06F 3/0653* (2013.01); *G06F 3/0688* (2013.01)

(58) Field of Classification Search
CPC ...... G05B 13/00–048; G05B 15/00–02; G05B 17/00–02; G06F 1/00–3296; G06F 3/00; G06F 3/06–0689; G06F 5/00–16; G06F 8/00–78; G06F 9/00–548; G06F 11/00–3696; G06F 12/00–16; G06F 13/00–4295; G06F 15/00–825; G06F 16/00–986; G06F 18/00–41; G06F 17/00–40; G06F 21/00–88; G06F 2003/0697; G06F 2009/3883; G06F 2009/45562–45595; G06F 2015/761–768; G06F 2201/00–885; G06F 2206/00–20; G06F 2209/00–549; G06F 2211/00–902; G06F 2212/00–7211; G06F 2213/00–4004;
(Continued)

(56) References Cited

U.S. PATENT DOCUMENTS 5,608,672 A * 3/1997 Tang .................. G11C 16/3404
365/185.26
6,285,588 B1 * 9/2001 Fastow ................ G11C 16/14
365/185.26
(Continued)

OTHER PUBLICATIONS

Y. Cai, E. F. Haratsch, O. Mutlu and K. Mai, "Threshold voltage distribution in MLC NAND flash memory: Characterization, analysis, and modeling," 2013 Design, Automation & Test in Europe Conference & Exhibition (DATE), Grenoble, France, 2013, pp. 1285-1290, doi: 10.7873/DATE.2013.266. (Year: 2013).*
(Continued)

*Primary Examiner* — Daniel C. Chappell
(74) *Attorney, Agent, or Firm* — Schwegman Lundberg & Woessner, P.A.

(57) ABSTRACT

A set of threshold voltage distribution width measurements are obtained for a block in a memory device. An endurance estimate is determined for the block based on the threshold voltage distribution width measurements. The endurance estimate comprises an indication of an estimated number of program/erase cycles during which data can be reliably stored by the block. One or more parameters of the block are managed based on the endurance estimate.

20 Claims, 7 Drawing Sheets

(58) Field of Classification Search
CPC ........ G06F 2216/00–17; G06F 2221/00–2153;
G06N 3/00–126; G06N 5/00–048; G06N
7/00–08; G06N 10/00; G06N 20/00–20;
G06N 99/00–007; G06T 1/00–60; G06V
30/00–43; G11B 20/00–24; G11B
33/00–1493; G11C 11/00–5692; G11C
13/00–06; G11C 14/00–009; G11C
15/00–06; G11C 16/00–3495; G11C
17/00–18; G11C 2207/00–229; G11C
2216/00–30; H01L 25/00–50; H01L
2225/00–1094; H03M 7/00–707; H04L
9/00–38; H04L 12/00–66; H04L
41/00–5096; H04L 49/00–9094; H04L
61/00–59; H04L 67/00–75
See application file for complete search history.

(56) References Cited

U.S. PATENT DOCUMENTS

| | | | | |
|---|---|---|---|---|
| 6,429,081 | B1* | 8/2002 | Doong | H10B 69/00 438/257 |
| 6,606,273 | B1* | 8/2003 | Guo | G11C 29/50 365/201 |
| 9,047,955 | B2* | 6/2015 | Cometti | G11C 16/06 |
| 9,195,586 | B2* | 11/2015 | Cometti | G06F 3/0619 |
| 9,224,456 | B2* | 12/2015 | Cometti | G11C 16/06 |
| 9,377,962 | B2* | 6/2016 | Cometti | G06F 3/0629 |
| 9,449,702 | B1* | 9/2016 | Pinkovich | G01R 21/06 |
| 9,954,558 | B1* | 4/2018 | Steiner | G11C 11/5642 |
| 10,373,693 | B2* | 8/2019 | Cha | G11C 16/3418 |
| 2002/0133679 | A1* | 9/2002 | Choi | G11C 16/3409 711/154 |
| 2004/0080979 | A1* | 4/2004 | Park | G11C 16/26 365/185.03 |
| 2014/0198569 | A1* | 7/2014 | Kim | G11C 16/28 365/185.2 |
| 2016/0148693 | A1* | 5/2016 | Lee | G11C 11/5628 365/185.11 |
| 2017/0277629 | A1* | 9/2017 | Li | G11C 16/349 |
| 2020/0183615 | A1* | 6/2020 | Liikanen | G11C 13/0069 |
| 2021/0055990 | A1* | 2/2021 | Iwasaki | G06F 11/1068 |
| 2023/0282289 | A1* | 9/2023 | Sanuki | H10B 43/00 711/101 |

OTHER PUBLICATIONS

C. Jiang, D. Zhang, S. Zhang and H. Wang, "Near-threshold SRAM design with dynamic write-assist circuitry," 2016 International Conference on Computer, Information and Telecommunication Systems (CITS), Kunming, China, 2016, pp. 1-5, doi: 10.1109/CITS.2016.7546413. (Year: 2016).*

I. Akturk, N. S. Kim and U. R. Karpuzcu, "Decoupled Control and Data Processing for Approximate Near-Threshold Voltage Computing," in IEEE Micro, vol. 35, No. 4, pp. 70-78, Jul.-Aug. 2015, doi: 10.1109/MM.2015.85. (Year: 2015).*

A. Gebregiorgis and M. B. Tahoori, "Reliability analysis and mitigation of near threshold caches," 2017 International Mixed Signals Testing Workshop (IMSTW), Thessaloniki, Greece, 2017, pp. 1-6, doi: 10.1109/IMS3TW.2017.7995203. (Year: 2017).*

Wei Wang, Tao Xie, and Deng Zhou. 2014. Understanding the impact of threshold voltage on MLC flash memory performance and reliability. In Proceedings of the 28th ACM international conference on Supercomputing (ICS '14). Association for Computing Machinery, New York, NY, USA, 201-210. (Year: 2014).*

* cited by examiner

DYNAMIC BLOCK CATEGORIZATION TO IMPROVE RELIABILITY AND PERFORMANCE IN MEMORY SUB-SYSTEM

TECHNICAL FIELD

Embodiments of the disclosure relate generally to memory sub-systems and, more specifically, to dynamic block categorization to improve reliability and performance in memory sub-systems.

BACKGROUND

A memory sub-system can include one or more memory devices that store data. The memory components can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure.

DETAILED DESCRIPTION

Figure 1:
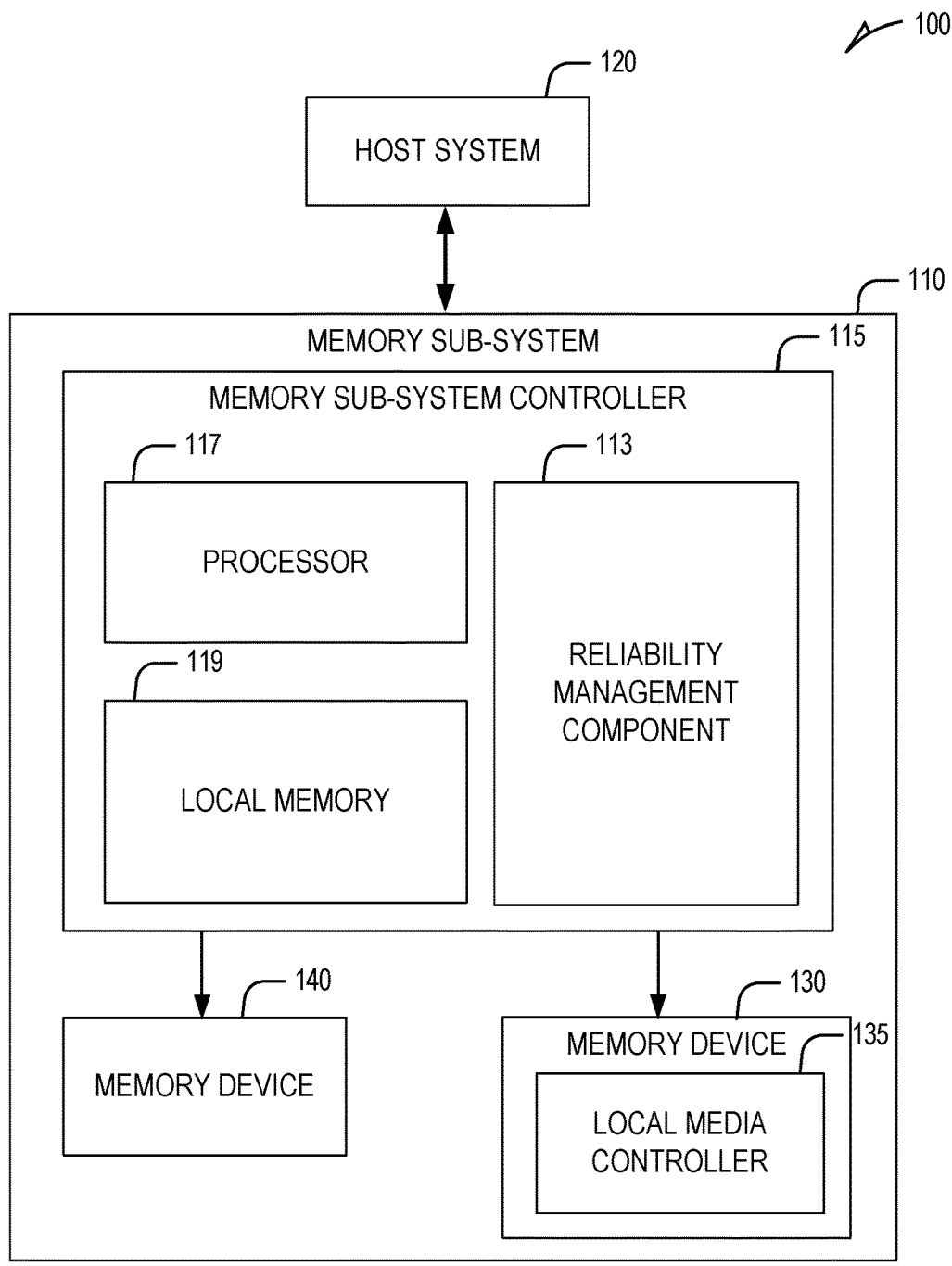
FIG. 1 is a block diagram illustrating an example computing environment that includes a memory sub-system, in accordance with some embodiments of the present disclosure.

Aspects of the present disclosure are directed to dynamic block categorization in a memory device in a memory sub-system. A memory sub-system can be a storage device, a memory module, or a hybrid of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory device can be a non-volatile memory device. One example of non-volatile memory devices is a negative-and (NAND) memory device. Other examples of non-volatile memory devices are described below in conjunction with FIG. 1. Data operations can be performed by the memory sub-system. The data operations can be host-initiated operations. For example, the host system can initiate a data operation (e.g., write, read, erase, etc.) on a memory sub-system. The host system can send access requests (e.g., write command, read command) to the memory sub-system, such as to store data on a memory device at the memory sub-system and to read data from the memory device on the memory sub-system.

Some memory devices (e.g., NAND memory devices) include an array of memory cells (e.g., flash cells) to store data. Each cell includes a transistor, and within each cell, data is stored as the threshold voltage ($V_T$) of the transistor. During a read operation, a read reference voltage is applied to the transistor to determine a value of data stored by the transistor. Memory cells in these devices can be grouped as pages that can refer to a logical unit of the memory device used to store data. With some types of memory devices (e.g., NAND), pages are grouped to form blocks (also referred to herein as "memory blocks"). One type of memory cell, for example, single level cells (SLC), can store one bit per cell. Other types of memory cells, such as multi-level cells (MLCs), triple level cells (TLCs), quad-level cells (QLCs), and penta-level cells (PLCs) can store multiple bits per cell. A memory device can include one or more arrays of SLCs, MLCs, TLCs, QLCs, or any combination of such.

Some memory sub-systems use static SLC caching schemes where a small pool of SLC blocks (blocks comprising SLCs) are used as a cache for user data before the data is written to TLC or QLC blocks. The purpose of the SLC cache is to improve system performance while writing bursts of user data and/or to buffer user data before folding into TLC/QLC blocks to prevent conditions in which TLC or QLC bocks are partially programmed. Program/erase cycles requirements for static SLC cycling are generally increasing in part because of a reduction to the size of SLC caches to reduce overprovisioning space. In addition, endurance improvements to TLC and QLC blocks as well as new and different memory device architectures are leading to a dramatic increase in the expected endurance of static SLC blocks.

Aspects of the present disclosure address the foregoing issues, among others, with a memory sub-system that monitors and estimates endurance and reliability of memory blocks over their lifetime. As used herein, the "endurance" of a memory block comprises a number of program/erase cycles during which data can be reliably stored by the block; in this context, reliability refers to the ability of the block to retain data without degradation. In general, data retention capability of blocks as they are cycled is proportional to the change in width of the threshold voltage distribution (also referred to herein as "threshold voltage distribution width") in the block. Hence, the threshold voltage distribution width can be a proxy for data retention capability. Accordingly, the memory sub-system can monitor the changes to the threshold voltage distribution widths (also referred to herein as "threshold voltage distribution width degradation rate") of blocks as they are cycled to estimate the endurance of the blocks.

Consistent with some embodiments, the memory sub-system can evaluate threshold voltage distribution widths among blocks in a memory device to determine endurance estimates for the blocks. For example, blocks in a memory device can be assigned to one of multiple endurance categories based on threshold voltage distribution width degradation rates, and the category to which each block is assigned provides an estimated number of program/erase cycles that can reliably be performed on the blocks in the category. The memory sub-system can manage parameters of the blocks based on the endurance estimates to improve the overall endurance and reliability of the blocks. For example, the memory sub-system can dynamically adjust wear-leveling for blocks that are estimated as being capable of a greater number of program/erase cycles based on the endurance category. As another example, the memory sub-system can retire a block upon detecting a threshold number of program/erase cycles being performed at the block where the threshold is determined based on the endurance estimate.

By evaluating threshold voltage distribution widths such as the rate of change of a voltage level distribution width growth, the memory sub-systems can predict which blocks have the best endurance, thereby improving the average endurance of blocks used for caching (e.g., blocks from a SLC block pool), which can help reduce overprovisioning (e.g., a number of blocks that are set aside for the SLC cache) and lead to improved system yield and performance. With reference to memory device qualification, if a device is qualified to a certain endurance and reliability thresholds, all blocks on the device must be capable of meeting those thresholds. The approach to reliability management described herein allows the memory sub-system to extend these thresholds by identifying blocks that barely meet the minimum threshold and handling these blocks appropriately. Blocks which exceed the threshold may continue to be used, or used more often, which can, for example, extend a useful life of a static SLC cache.

FIG. 1 illustrates an example computing system 100 that includes a memory sub-system 110, in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include multiple host systems that are coupled to one or more memory sub-systems 110. In some embodiments, the host system 120 is coupled to different types of memory sub-system 110. FIG. 1 illustrates example host system 120 that is coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, and the like.

The host system 120 can include a processor chipset and a software stack executed by the processor chipset. The processor chipset can include one or more cores, one or more caches, a memory controller (e.g., NVDIMM controller), and a storage protocol controller (e.g., peripheral component interconnect express (PCIe) controller, serial advanced technology attachment (SATA) controller). The host system 120 uses the memory sub-system 110, for example, to write data to the memory sub-system 110 and read data from the memory sub-system 110.

The host system 120 can be coupled to the memory sub-system 110 via a host interface. Examples of a host interface include, but are not limited to, a SATA interface, a PCIe interface, USB interface, Fibre Channel, Serial Attached SCSI (SAS), Small Computer System Interface (SCSI), a double data rate (DDR) memory bus, a DIMM interface (e.g., DIMM socket interface that supports Double Data Rate (DDR)), Open NAND Flash Interface (ONFI), Double Data Rate (DDR), Low Power Double Data Rate (LPDDR), or any other interface. The host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the PCIe interface. The host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include NAND type flash memory and write-in-place memory, such as a three-dimensional (3D) cross-point memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and 3D NAND.

Each of the memory devices 130 can include one or more arrays of memory cells. One type of memory cell, for example, single level cells (SLC), can store one bit per cell. Other types of memory cells, such as multi-level cells (MLCs), triple level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion and an MLC portion, a TLC portion, a QLC portion, or a PLC portion of memory cells. The memory cells of the memory devices 130 can be grouped as pages that can refer to a logical unit of the memory device used to store data. For example, memory cells in NAND memory devices are connected horizontally at their control gates to a word line to form a page. With some types of memory (e.g., NAND), pages can be grouped to form blocks. Additionally, word lines within a memory device can be organized into multiple word line groups, each of which includes one or more word lines, though each word line group includes fewer word lines than are included in a block.

Although non-volatile memory components such as NAND type flash memory (e.g., 2D NAND, 3D NAND) and 3D cross-point array of non-volatile memory cells are described, the memory device 130 can be based on any other type of non-volatile memory, such as read-only memory (ROM), phase change memory (PCM), self-selecting memory, other chalcogenide-based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide-based RRAM (OxRAM), NOR flash memory, and electrically erasable programmable read-only memory (EEPROM).

A memory sub-system controller 115 (or controller 115 for simplicity) can communicate with the memory devices 130 and 140 to perform operations such as reading data, writing data, or erasing data at the memory devices 130 and 140 and other such operations. The memory sub-system controller 115 can include hardware such as one or more integrated circuits and/or discrete components, a buffer memory, or a combination thereof. The hardware can include digital circuitry with dedicated (i.e., hard-coded) logic to perform the operations described herein. The memory sub-system controller 115 can be a microcontroller, special-purpose logic circuitry (e.g., a field programmable gate array (FPGA), an application-specific integrated circuit (ASIC), etc.), or another suitable processor.

The memory sub-system controller 115 can include a processor 117 (processing device) configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, and the like. The local memory 119 can also include ROM for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130 and/or the memory device 140. The memory sub-system controller 115 can be responsible for other operations such as wear leveling operations, garbage collection operations, error detection and ECC operations, encryption operations, caching operations, and address translations between a logical address (e.g., logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system 120 into command instructions to access the memory devices 130 and/or the memory device 140 and convert responses associated with the memory devices 130 and/or the memory device 140 into information for the host system 120.

In some embodiments, the memory device 130 includes a local media controller 135 that operates in conjunction with memory sub-system controller 115 to execute operations on one or more memory cells of the memory devices 130.

The memory sub-system 110 also includes a reliability management component 113 that is responsible for determining endurance estimates for blocks in the memory device 130 and/or memory device 140 and improving block reliability and performance based there on. As will be discussed in further detail below, the reliability management component 113 monitors $V_T$ distribution widths in the blocks over a predetermined number of program/erase cycles, and generates endurance estimates based on the $V_T$ distribution widths. The endurance estimates may, for example, be used to dynamically adjust wear-leveling on blocks, move blocks from static to dynamic pools, and retire the blocks. Further details are discussed below.

In some embodiments, the memory sub-system controller 115 includes at least a portion of the reliability management component 113. For example, the memory sub-system controller 115 can include a processor 117 (processing device) configured to execute instructions stored in local memory 119 for performing the operations described herein. In some embodiments, at least a portion of the reliability management component 113 is part of the host system 120, an application, or an operating system. In some embodiments, the memory device 130 includes at least a portion of the reliability management component 113. For example, as noted above, the memory device 130 includes the local media controller 135 that operates in conjunction with the memory sub-system controller 115 to execute operations on one or more memory cells of the memory devices 130.

Figure 2:
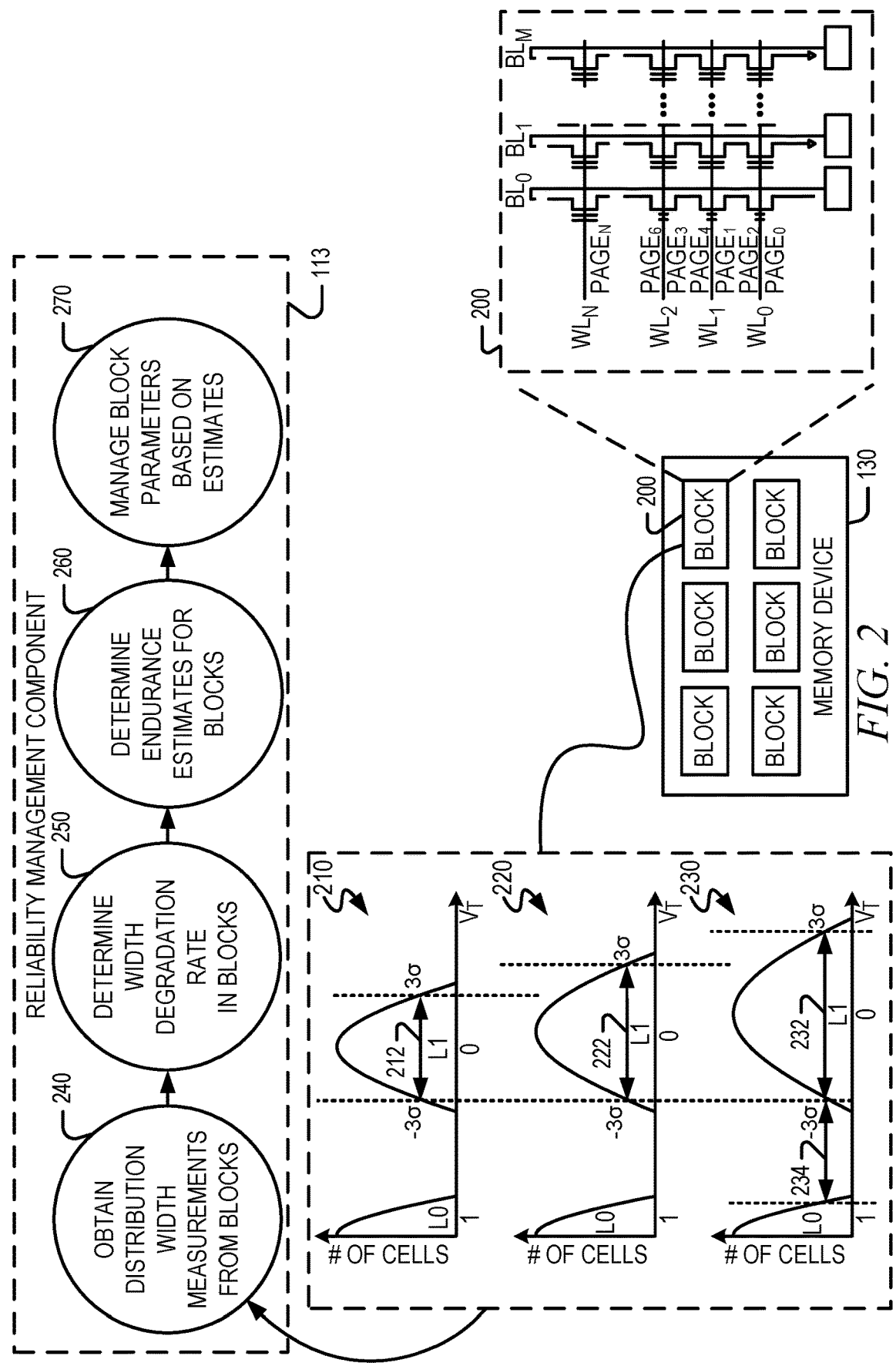
FIG. 2 is an interaction diagram illustrating example interactions between components of the memory sub-system in performing dynamic block categorization, in accordance with some embodiments of the present disclosure.

FIG. 2 is an interaction diagram illustrating example interactions between components of the memory sub-system in performing dynamic block categorization, in accordance with some embodiments of the present disclosure. In the example illustrated in FIG. 2 the memory device 130 is a NAND memory device that includes multiple memory blocks.

As shown, a NAND block 200 includes an array of pages (rows) and strings (columns). Each NAND cell includes a transistor, and within each cell, data is stored as the $V_T$ of the transistor. SLC NAND, for example, can store one bit per cell. Other types of memory cells, such as MLCs, TLCs, QLCs, and PLCs, can store multiple bits per cell. Strings are connected within the NAND block 200 to allow storage and retrieval of data from selected cells. NAND cells in the same column are connected in series to form a bit line (BL). All cells in a bit line are connected to a common ground on one end and a common sense amplifier on the other for reading the $V_T$ of one of the cells when decoding data. NAND cells are connected horizontally at their control gates to a word line (WL) to form a page. In MLC, TLC, QLC, and PLC NAND, a page is a set of connected cells that share the same word line and is the minimum unit to program.

As noted above, each NAND cell stores data in the form of the $V_T$ of the transistor. The range of threshold voltages of a memory cell is divided into a number of regions based on the number of bits stored by the cell, and each region corresponds to a value that can be represented by the cell.

More specifically, each region corresponds to a charge level and each charge level decodes into a value. As an example, a SLC NAND flash cell can be at one of two charge levels—L0 or L1. Each charge level decodes into a 1-bit value that is stored in the flash cell (e.g., 0 or 1). Graphs 210, 220, and 230 illustrate mappings between programmed logic values and corresponding $V_T$ distributions for an example in which the block 200 comprises SLCs.

In general, the reliability management component 113 uses $V_T$ distribution data, such as that illustrated by graphs 210, 220, and 230, to generate endurance estimates for blocks 200 in the memory device 130. More specifically, as shown, at operation 240, the reliability management component 113 obtains a set of $V_T$ distribution width measurements for each block 200 in the memory device 130. The set of $V_T$ distribution width measurements can be collected in a table or other data structure. The set of $V_T$ distribution width measurements correspond specifically to a width of $V_T$ distributions for a particular charge level (e.g., L1). As shown in graph 210, for some embodiments, a $V_T$ distribution width 212 can be determined based on a difference between three standard deviations greater than the mean of the distribution and three standard deviations less than the mean (i.e., $(3\sigma+\mu)-(\mu-3\sigma)$). For some embodiments, three standard deviations greater than the mean of the distribution corresponds to the "top edge" of the distribution and three standard deviations less than the mean of the distribution corresponds to the "bottom edge" of the distribution. It shall be appreciated that the top edge and bottom edge may vary based on embodiments and in other embodiments, other top edges and bottom edges can be used in evaluating $V_T$ distribution width measurements.

For a given block 200, the reliability management component 113 obtains $V_T$ distribution data comprising a set of $V_T$ distribution width measurements at various intervals based on a number of program/erase cycles performed on the block 200. For example, the reliability management component 113 can obtain the $V_T$ distribution width 212 at a first time based on a first number of program/erase cycles being performed on the block 200, obtain $V_T$ distribution width 222 at a second time based on a second number of program/erase cycles being performed on the block 200, obtain $V_T$ distribution width 232 at a third time based on a third number of program/erase cycles being performed on the block 200, and so forth.

To obtain $V_T$ distribution width measurement, the reliability management component 113 performs multiple reads on the block. During a typical read operation, a read reference voltage is applied to cells being read to determine a value of data stored in the cells. In performing the multiple reads to obtain a $V_T$ distribution width measurement, the reliability management component 113 iteratively adjusts the read reference voltage (e.g., by adjusting one or more internal settings to increase and decrease the read reference voltage) to identify the top and bottom edges of the distribution.

As shown by the graphs 210, 220, and 230, the $V_T$ distribution width increases with the number of program/erase cycles performed on the block 200 (e.g., due to higher trap-ups). This increase in $V_T$ distribution width can also be referred to as "$V_T$ distribution width degradation." The reliability management component 113 may, in some embodiments, use the set of $V_T$ distribution width measurements to determine a $V_T$ distribution width degradation rate (at operation 250). That is, the reliability management component 113 may use the set of $V_T$ distribution width measurements to determine a rate of change to $V_T$ distribution width in the block 200.

At operation 260, the reliability management component 113 determines an endurance estimate for each block 200 based on respective $V_T$ distribution widths (e.g., based on $V_T$ distribution width degradation rates). Each endurance estimate comprises an indication of an estimated maximum number of program/erase cycles during which data can be reliably stored by a block. For some embodiments, the reliability management component 113 assigns each block to one of multiple endurance categories, and each endurance category comprises an endurance estimate. To determine endurance categories, the reliability management component 113 may compare the $V_T$ distribution widths and/or the $V_T$ distribution degradation rates and assign each block 200 in the memory device 130 to one of multiple endurance categories based on the comparison.

For some embodiments, the endurance estimate comprises an estimated data retention margin at one or more intervals. A data retention margin corresponds to a margin between a $V_T$ distribution for a charge level and the $V_T$ distribution for the preceding charge level. That is, the data retention margin may correspond to the margin between the top edge of a first charge level $V_T$ distribution and the bottom edge of a second level $V_T$ distribution. For example, graph 230 shows a data retention margin 234 between the top edge of the L0 $V_T$ distribution and the bottom edge of the L1 $V_T$ distribution. The reliability management component 113 can determine an estimate of the data retention margin at a predetermined time (e.g., 1 year) or after a predetermined number of program/erase cycles.

The reliability management component 113 uses the endurance estimates determined for each block 200 to manage block parameters to improve reliability of the blocks (operation 270). For example, the reliability management component 113 can dynamically adjust wear-leveling on a given block 200 based on the underlying endurance estimate for the block 200. That is, wear-leveling can be used to put additional cycles on blocks with a high endurance estimate and fewer cycles on blocks with a low endurance estimate such that all blocks wear out at nearly the same time. As another example, the reliability management component 113 can assign a program/erase cycle threshold to a given block 200 based on the estimated endurance. The program/erase cycle threshold defines a maximum number of program/erase cycles to be performed on the block 200. Hence, upon detecting the program/erase cycle threshold is satisfied based on the maximum number of program/erase cycles being performed on the block, the reliability management component 113 retires the block. As yet another example, rather than retiring a block that satisfies the program/erase cycle threshold, the reliability management component 113 can assign the block to non-essential data storage.

Figure 3:
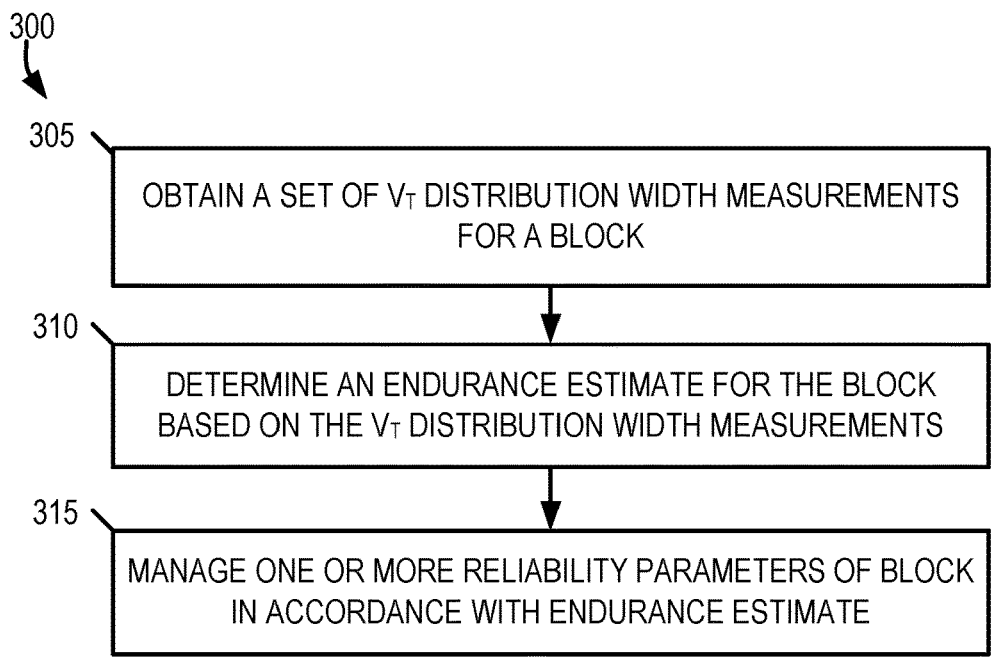
FIGS. 3-5 are flow diagrams illustrating an example method for performing dynamic block categorization on a memory device, in accordance with some embodiments of the present disclosure.

FIG. 3 is a flow diagram illustrating an example method 300 for performing dynamic block binning on a memory device (e.g., the memory device 130), in accordance with some embodiments of the present disclosure. The method 300 can be performed by processing logic that can include hardware (e.g., a processing device, circuitry, dedicated logic, programmable logic, microcode, hardware of a device, an integrated circuit, etc.), software (e.g., instructions run or executed on a processing device), or a combination thereof. In some embodiments, the method 300 is performed by the reliability management component 113 of FIG. 1. Although processes are shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are made use of in every embodiment. Other process flows are possible.

At operation 305, the processing device obtains a set of $V_T$ distribution width measurements for a block (e.g., block 200) in the memory device. The set of $V_T$ distribution width measurements can be collected in a table or other data structure stored within a local memory component of the memory device. The set of $V_T$ distribution width measurements correspond to the $V_T$ distribution at a particular charge level (e.g., L1). The obtaining of the set of width measurements can include measuring the $V_T$ distribution width for the block at various intervals over the lifetime of the memory device. For example, the processing device can, at a first time, measure a first $V_T$ distribution width based on a first number of program/erase cycles having been performed on the block; measure, at a second time, a second $V_T$ distribution width based on a second number of program/erase cycles having been performed, and so forth. To obtain a $V_T$ distribution width measurement, the processing device performs multiple reads on the block while iteratively adjusting the read voltage to identify a top and a bottom edge of the $V_T$ distribution for the block. The processing device computes the $V_T$ distribution width measurement based on the difference between the top and bottom edge of the $V_T$ distribution for the block.

At operation 310, the processing device determines an endurance estimate for the block based on the $V_T$ distribution width measurements. The endurance estimate comprises an indication of an estimated number of program/erase cycles during which data can reliably be stored by the block. Depending on the embodiment, an endurance estimate may comprise or correspond to any one or more of: an estimated data retention margin at one or more intervals, an estimated read disturb margin at one or more intervals, an estimated cross temperature at one or more intervals, or an estimate of any other reliability factor from which an end-of-life for the block can be determined.

For some embodiments, the processing device determines the endurance estimate for the block based on a comparison of the $V_T$ distribution width measurements for the block with the $V_T$ distribution width measurements of other blocks. For example, blocks in the memory device may be assigned to one of multiple endurance categories based on respective $V_T$ distribution width measurements and each category may comprise an endurance estimate for blocks in the category.

As will be discussed below, for some embodiments, the processing device determines the endurance estimate based on a $V_T$ distribution width degradation rate determined from the $V_T$ distribution width measurements. For some embodiments, the processing device determines the endurance estimate for the block based on a combination of a $V_T$ distribution width measurement and $V_T$ distribution width degradation rate determined from the $V_T$ distribution width measurements. For some embodiments, the processing device determines endurance estimates based further on any one or more of: a $V_T$ distribution width degradation rate of the block, a data retention margin of the block, a read-disturb margin of the block, or a cross temperature measurement for the block.

For some embodiments, the processing device determines the endurance estimate formulaically based at least on the $V_T$ distribution width measurements. For some embodiments, the processing device determines the endurance estimate based on a look-up table (e.g., stored in local memory 119 or one of the memory devices 130 or 140). The look-up table may, for example, include a mapping between $V_T$ distribution width measurements (or more specifically $V_T$ distribution width degradation rates) and endurance estimates. For some embodiments, the look-up table may include a first mapping between $V_T$ distribution width measurements (or more specifically $V_T$ distribution width degradation rates) and endurance categories and a second mapping between endurance categories and endurance estimates. Accordingly, consistent with these embodiments, the processing device accesses a look-up table to determine the endurance estimate for the block.

Whether determined by formula or by look-up table, endurance estimation techniques can be based on a comparison of historical $V_T$ distribution width measurements and/or $V_T$ distribution width degradation rates with any one or more of: historical data retention margins, historical read-disturb margins, historical cross temperature measurements along with any other reliability mechanism that can be used to determine the end-of-life for a block.

At operation 315, the processing device manages one or more parameters of the block to improve reliability of the block based on the endurance estimate determined for the block. For example, the processing device can dynamically adjust wear-leveling on the block in accordance with the endurance estimate corresponding to the endurance category. As another example, the processing device can assign a program/erase cycle threshold to the block based on the endurance category. The program/erase cycle threshold defines a maximum number of program/erase cycles to be performed by the block. Accordingly, upon determining that the program/erase cycle threshold for the block has been reached (i.e., the maximum number of program/erase cycles have been performed on the block), the processing device retires the block. As yet another example, based on the endurance category, the processing device may maintain the block in a static SLC pool for up to a certain number of program/erase cycles (e.g., 60K), and then use that block for other purposes after that.

Figure 4:
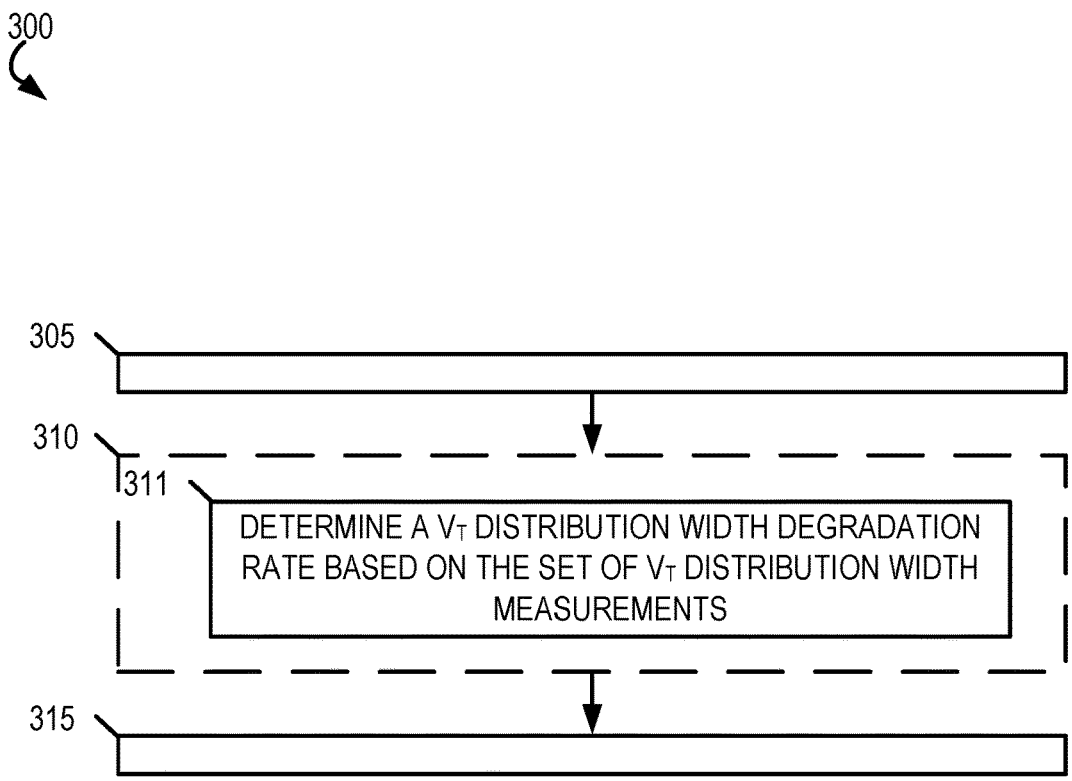

As shown in FIG. 4, the method 300 can, in some embodiments, includes operation 311. Consistent with these embodiments, the operation 311 can be performed as part of the operation 310 where the processing device determines an endurance estimate for the block based on the set of $V_T$ distribution width measurements. At operation 311, the processing device determines a $V_T$ distribution width degradation rate based on the set of $V_T$ distribution width measurements. That is, the processing device uses the set of $V_T$ distribution width measurements to determine a rate of change of the $V_T$ distribution width for the block (e.g., A $V_T$ distribution width/1000 P/E cycles). The processing device may determine the endurance estimate based on a comparison of the $V_T$ distribution width degradation rate for the block with other $V_T$ distribution width degradation rates corresponding to other blocks in the memory device. For example, the processing device may determine an endurance estimate for a first block based on a comparison of the $V_T$ distribution width degradation rate for the first block with a $V_T$ distribution width degradation of at least a second block.

Consistent with these embodiments, the processing device determines the endurance estimate for the block based on the $V_T$ distribution width degradation rate. For example, as noted above, the processing device may access a look-up table and use the $V_T$ distribution width degradation rate to identify an endurance estimate from the look-up table. As another example, the processing device may determine an endurance estimate using a formula (determined from an analysis of historical data) that includes the $V_T$ distribution width degradation rate for the block.

Figure 5:
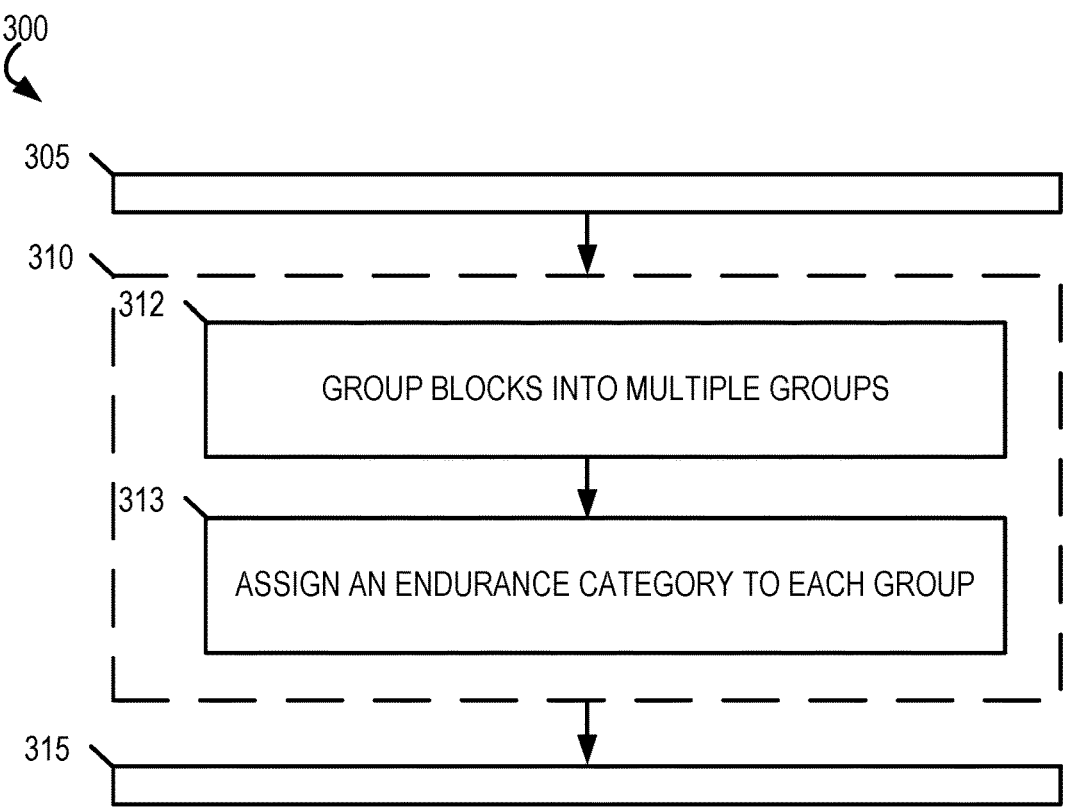

As shown in FIG. 5, the method 300 can, in some embodiments, includes operation 312 and 313. Consistent with these embodiments, the operations 312 and 313 can be performed as part of the operation 310 where the processing device determines an endurance estimate for the block based on the set of $V_T$ distribution width measurements. At operation 312, the processing device groups a blocks of the memory device into multiple groups based on the set of $V_T$ distribution width measurements. For example, the processing device may evaluate the $V_T$ distribution width degradation rates to determine the range of $V_T$ distribution width degradation rates among the blocks and the processing device may divide the range into multiple sub-ranges where each sub-range corresponds to a group. That is, blocks with a $V_T$ distribution width degradation rate within a given sub-range are assigned to a group corresponding to the sub-range.

At operation 313, the processing device assigns an endurance category to each group. A given endurance category comprises an estimated maximum number of program/erase cycles during which data can be reliably stored by blocks assigned to the category.

Figure 6:
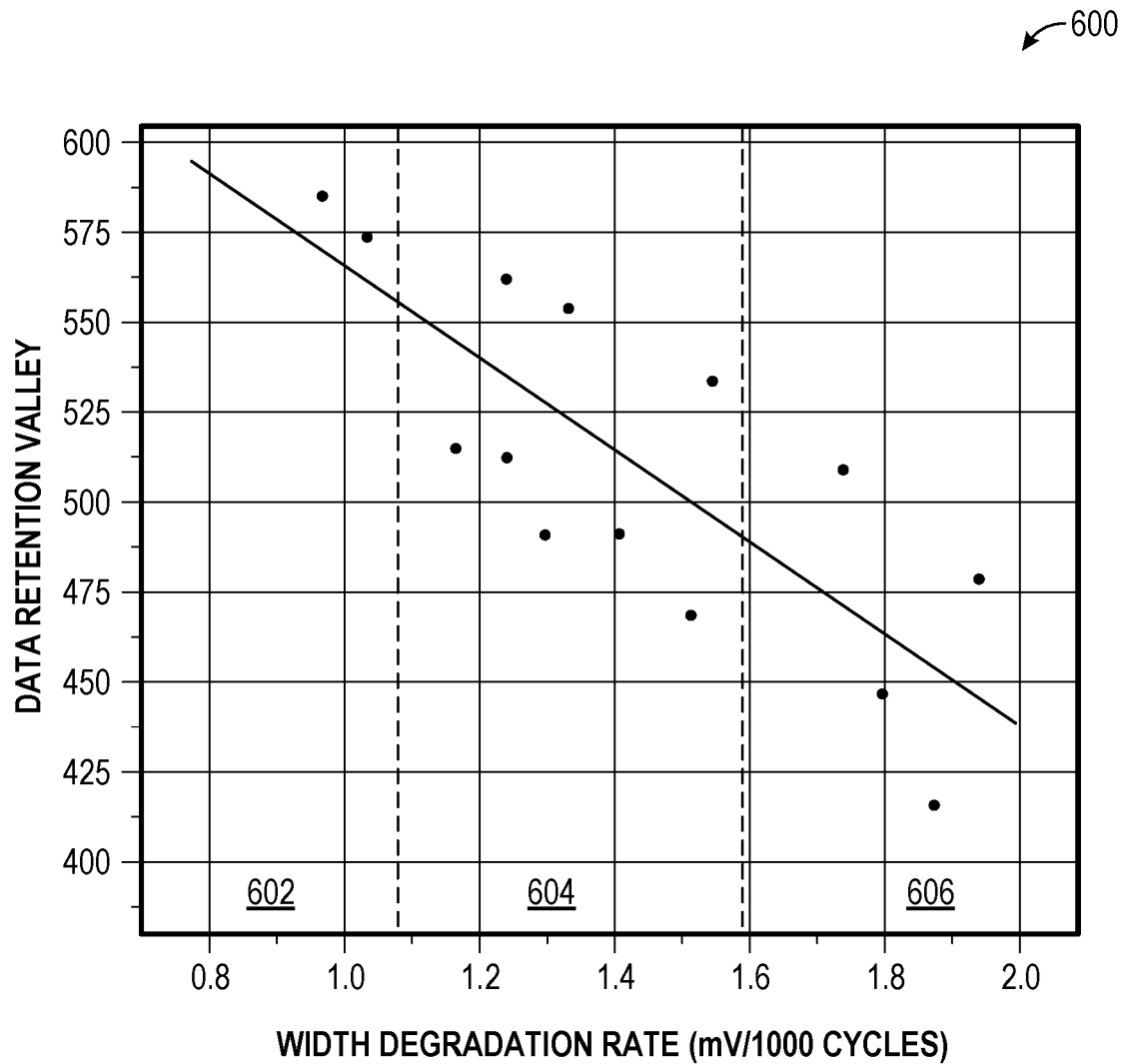
FIG. 6 is a graph of example threshold voltage distribution width degradation rates used by the memory sub-system in performing dynamic block categorization, in accordance with some embodiments of the present disclosure.

As an example of the effectiveness of endurance estimation techniques described herein, a plot 600 of charge level width degradation rates vs data retention margins for blocks in a memory device is illustrated in FIG. 6. Generally, the plot 600 illustrates that blocks with a lower $V_T$ distribution width degradation rates have a higher data retention capability.

The plot 600 is divided into region 602, 604, and 606. Each data point in the plot 600 corresponds to a block in the memory device. In this example, blocks corresponding to the region 602 may be estimated to reliably perform 100K program/erase cycles, blocks corresponding to the region 604 may be estimated to reliably perform 80K program/erase cycles, and blocks corresponding to the region 606 are estimated to reliably perform 60K program/erase cycles. Accordingly, for blocks corresponding to the region 602, the reliability management component 113 can maintain the blocks in a static SLC pool until 100K program/erase cycles are reached in any one block, which is then retired. For blocks corresponding to the region 604, the reliability management component 113 can maintain the blocks in a static SLC pool for up to 80K cycles and then utilizes the blocks for an alternative purpose thereafter (e.g., storing non-essential data). For blocks corresponding to the region 606, the reliability management component 113 can maintain the blocks in a static SLC pool for up to 60K cycles and then utilize the blocks for an alternative purpose thereafter (e.g., storing non-essential data). Although FIG. 6 specifically addresses data retention margin, it shall be appreciated that the approach to estimating block endurance described herein is not limited to endurances estimates that correspond specifically to data retention margin, and this approach may include estimations of endurance that correspond to other reliability factors such as read disturb margin or cross temperature.

Described implementations of the subject matter can include one or more features, alone or in combination as illustrated below by way of example.

Example 1 is a system comprising: a memory device comprising a set of blocks; and a processing device coupled to the memory device, the processing device configured to perform operations comprising: obtaining a set of threshold voltage distribution width measurements for a block in the set of blocks; determining an endurance estimate for the block based on the set of threshold voltage distribution width measurements, the endurance estimate comprising an indication of an estimated number of program/erase cycles during which the block is able to store data reliably; and managing one or more parameters of the block based on the endurance estimate.

Example 2 includes the system of Example 1, wherein the operations further comprise determining a threshold voltage distribution width degradation rate for the block based on the set of threshold voltage distribution width measurements.

Example 3 includes the system of any one or more of Examples 1 or 2, wherein the determining of the endurance estimate for the block comprises determining the endurance estimate based on the threshold voltage distribution width degradation rate.

Example 4 includes the system of any one or more of Examples 1-3, wherein: the block is a first block; the threshold voltage distribution width degradation rate is a first threshold voltage distribution width degradation rate; and the determining of the endurance estimate is based on a comparison of the first threshold voltage distribution width degradation rate to a second threshold voltage distribution width degradation rate corresponding to a second block.

Example 5 includes the system of any one or more of Examples 1-4, wherein the determining of the endurance estimate for the block comprises accessing look-up table to identify the endurance estimate using the set of threshold voltage distribution width measurements.

Example 6 includes the system of any one or more of Examples 1-5, wherein determining the endurance estimate comprises assigning an endurance category to the block based on the set of threshold voltage distribution width measurements, the endurance category being associated with the endurance estimate.

Example 7 includes the system of any one or more of Examples 1-6, wherein determining the endurance estimate comprises: assigning the block to a group among multiple groups into which the set of blocks are grouped based on the threshold voltage distribution width measurements; and assigning the group to an endurance category, the endurance category being associated with the endurance estimate.

Example 8 includes the system of any one or more of Examples 1-7, wherein the obtaining of the set of threshold voltage distribution width measurements comprises: measuring a first threshold voltage distribution width for the block based on a first number of program/erase cycles being performed on the block; and measuring a second threshold voltage distribution width for the block based on a second number of program/erase cycles being performed on the block.

Example 9 includes the system of any one or more of Examples 1-8, wherein the measuring of the first threshold voltage distribution width comprises: determining a top edge and bottom edge of a threshold voltage distribution of the block; and determining a difference between the top edge and the bottom edge of the threshold voltage distribution.

Example 10 includes the system of any one or more of Examples 1-9, wherein the managing of the one or more parameters comprises: assigning a program/erase cycle threshold to the block based on the estimated endurance, the program/erase cycle threshold defining a maximum number of program/erase cycles to be performed on the block; determining the maximum number of program/erase cycles have been performed on the block; and based on the determining the maximum number of program/erase cycles have been performed, retiring the block.

Example 11 includes the system of any one or more of Examples 1-10, wherein the managing of the one or more parameters comprises dynamically adjusting wear-leveling on the block based on the endurance estimate.

Example 12 is a method comprising: obtaining a set of threshold voltage distribution width measurements for a block in the set of blocks; determining, by a processing device, an endurance estimate for the block based on the set of threshold voltage distribution width measurements, the endurance estimate comprising an indication of an estimated number of program/erase cycles during which the block is able to store data reliably; and managing one or more parameters of the block based on the endurance estimate.

Example 13 includes the method of Example 12, further comprising determining a threshold voltage distribution width degradation rate for the block based on the set of threshold voltage distribution width measurements.

Example 14 includes the method of any one or more of Examples 12 or 13, wherein the determining of the endurance estimate for the block comprises determining the endurance estimate based on the threshold voltage distribution width degradation rate.

Example 15 includes the method of any one or more of Examples 12-14, wherein: the block is a first block; the threshold voltage distribution width degradation rate is a first threshold voltage distribution width degradation rate; and the determining of the endurance estimate is based on a comparison of the first threshold voltage distribution width degradation rate to a second threshold voltage distribution width degradation rate corresponding to a second block.

Example 16 includes the method of any one or more of Examples 12-15, wherein the determining of the endurance estimate for the block comprises accessing look-up table to identify the endurance estimate using the set of threshold voltage distribution width measurements.

Example 17 includes the method of any one or more of Examples 12-16, wherein determining the endurance estimate comprises assigning an endurance category to the block based on the set of threshold voltage distribution width measurements, the endurance category being associated with the endurance estimate.

Example 18 includes the method of any one or more of Examples 12-17, wherein determining the endurance estimate comprises: assigning the block to a group among multiple groups into which the set of blocks are grouped based on the threshold voltage distribution width measurements; and assigning the group to an endurance category, the endurance category being associated with the endurance estimate.

Example 19 includes the method of any one or more of Examples 12-18, wherein the obtaining of the set of threshold voltage distribution width measurements comprises: measuring a first threshold voltage distribution width for the block based on a first number of program/erase cycles being performed on the block; and measuring a second threshold voltage distribution width for the block based on a second number of program/erase cycles being performed on the block.

Example 20 is a computer-readable storage medium comprising instructions that, when executed by a processing device, configure the processing device to perform operations comprising: obtaining a set of threshold voltage distribution width measurements for a block in the set of blocks; determining an endurance estimate for the block based on the set of threshold voltage distribution width measurements, the endurance estimate comprising an indication of an estimated number of program/erase cycles during which the block is able to store data reliably; and managing one or more parameters of the block based on the endurance estimate.

Figure 7:
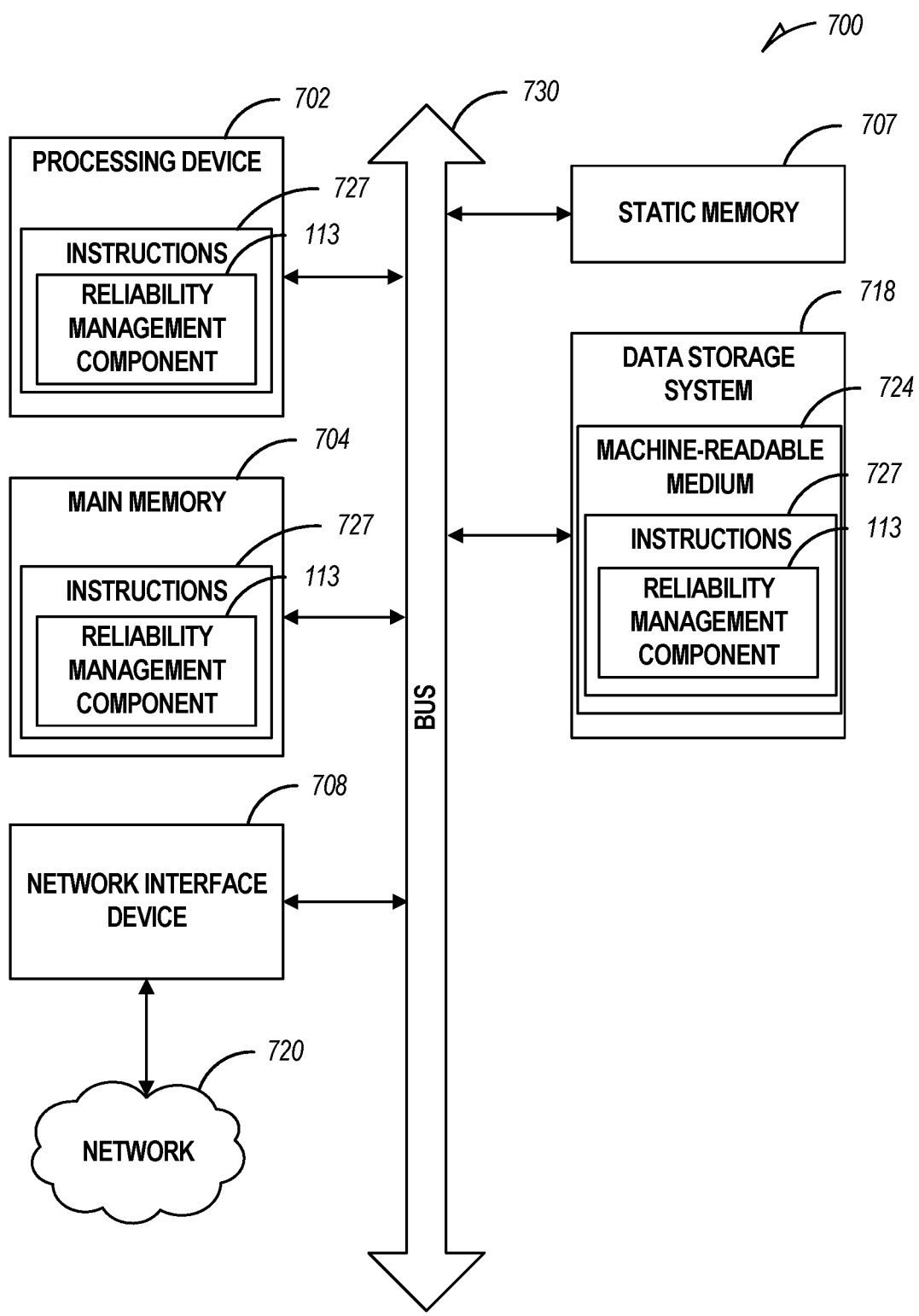
FIG. 7 is a block diagram of an example computer system in which embodiments of the present disclosure may operate.

FIG. 7 illustrates an example machine in the form of a computer system 700 within which a set of instructions can be executed for causing the machine to perform any one or more of the methodologies discussed herein. In some embodiments, the computer system 700 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the reliability management component 113 of FIG. 1). In alternative embodiments, the machine can be connected (e.g., networked) to other machines in a local area network (LAN), an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 700 includes a processing device 702, a main memory 704 (e.g., ROM, flash memory, DRAM such as SDRAM or RDRAM, etc.), a static memory 707 (e.g., flash memory, static random access memory (SRAM), etc.), and a data storage system 718, which communicate with each other via a bus 730.

Processing device 702 represents one or more general-purpose processing devices such as a microprocessor, a central processing unit, or the like. More particularly, the processing device 702 can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 702 can also be one or more special-purpose processing devices such as an ASIC, a FPGA, a digital signal processor (DSP), network processor, or the like. The processing device 702 is configured to execute instructions 727 for performing the operations and steps discussed herein. The computer system 700 can further include a network interface device 708 to communicate over a network 720.

The data storage system 718 can include a machine-readable storage medium 724 (also known as a computer-readable medium) on which is stored one or more sets of instructions 727 or software embodying any one or more of the methodologies or functions described herein. The instructions 727 can also reside, completely or at least partially, within the main memory 704 and/or within the processing device 702 during execution thereof by the computer system 700, the main memory 704 and the processing device 702 also constituting machine-readable storage media. The machine-readable storage medium 724, data storage system 718, and/or main memory 704 can correspond to the memory sub-system 110 of FIG. 1.

In one embodiment, the instructions 727 include instructions to implement functionality corresponding to a security component (e.g., the reliability management component 113 of FIG. 1). While the machine-readable storage medium 724 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be constructed for the intended purposes, or it can include a general purpose computer selectively activated or reconfigured by a computer program stored in the computer. Such a computer program can be stored in a computer-readable storage medium, such as, but not limited to, any type of disk including floppy disks, optical disks, CD-ROMs, and magnetic-optical disks, ROMs, RAMs, EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a ROM, RAM, magnetic disk storage media, optical storage media, flash memory components, etc.

In the foregoing specification, embodiments of the disclosure have been described with reference to specific example embodiments thereof. It will be evident that various modifications can be made thereto without departing from the broader scope of embodiments of the disclosure as set forth in the following claims. The specification and drawings are, accordingly, to be regarded in an illustrative sense rather than a restrictive sense.

What is claimed is:

1. A system comprising:
a memory device comprising a set of blocks; and
a processing device coupled to the memory device, the processing device configured to perform operations comprising:
obtaining a set of threshold voltage distribution width measurements for a block in the set of blocks;
determining a threshold voltage distribution width degradation rate for the block based on the set of threshold voltage distribution width measurements for the block, the threshold voltage distribution width degradation rate for the block comprising a rate of change of threshold voltage distribution width;
determining an endurance estimate for the block based on the set of threshold voltage distribution width measurements, the determining of the endurance estimate comprising determining an estimated number of program/erase cycles during which the block is able to store data reliably based on the threshold voltage distribution width degradation rate; and
managing one or more parameters of the block based on the endurance estimate.

2. The system of claim 1, wherein the operations further comprise:
determining a range of threshold voltage distribution width degradation rates among the set of blocks;
dividing the range into multiple sub-ranges;
determining an endurance category for the block based on the threshold voltage distribution width degradation rate for the block corresponding to a sub-range associated with the endurance category, the endurance category indicating the estimated number of program/erase cycles during which the block is able to store data reliably.

3. The system of claim 1, wherein the managing of the one or more parameters of the block comprises maintaining the block in a static single level cell pool for a number of program/erase cycles based on the endurance estimate.

4. The system of claim 1, wherein:
the block is a first block;
the threshold voltage distribution width degradation rate is a first threshold voltage distribution width degradation rate; and
the determining of the endurance estimate is based on a comparison of the first threshold voltage distribution width degradation rate to a second threshold voltage distribution width degradation rate corresponding to a second block.

5. The system of claim 1, wherein the determining of the endurance estimate for the block comprises accessing look-up table to identify the endurance estimate using the set of threshold voltage distribution width measurements.

6. The system of claim 1, wherein determining the endurance estimate comprises assigning an endurance category to the block based on the set of threshold voltage distribution width measurements, the endurance category being associated with the endurance estimate.

7. The system of claim 1, wherein determining the endurance estimate comprises:
assigning the block to a group among multiple groups into which the set of blocks are grouped based on the threshold voltage distribution width measurements; and
assigning the group to an endurance category, the endurance category being associated with the endurance estimate.

8. The system of claim 1, wherein the obtaining of the set of threshold voltage distribution width measurements comprises:
measuring a first threshold voltage distribution width for the block based on a first number of program/erase cycles being performed on the block; and
measuring a second threshold voltage distribution width for the block based on a second number of program/erase cycles being performed on the block.

9. The system of claim 8, wherein the measuring of the first threshold voltage distribution width comprises:
determining a top edge and bottom edge of a threshold voltage distribution of the block; and
determining a difference between the top edge and the bottom edge of the threshold voltage distribution.

10. The system of claim 1, wherein the managing of the one or more parameters comprises:
assigning a program/erase cycle threshold to the block based on the estimated endurance, the program/erase cycle threshold defining a maximum number of program/erase cycles to be performed on the block;
determining the maximum number of program/erase cycles have been performed on the block; and
based on the determining the maximum number of program/erase cycles have been performed, retiring the block.

11. The system of claim 1, wherein the managing of the one or more parameters comprises dynamically adjusting wear-leveling on the block based on the endurance estimate.

12. A method comprising:
obtaining a set of threshold voltage distribution width measurements for a block in a memory device;
determining a threshold voltage distribution width degradation rate for the block based on the set of threshold voltage distribution width measurements for the block, the threshold voltage distribution width degradation rate for the block comprising a rate of change of threshold voltage distribution width;
determining, by a processing device, an endurance estimate for the block based on the set of threshold voltage distribution width measurements, the determining of the endurance estimate comprising determining an estimated number of program/erase cycles during which the block is able to store data reliably based on the threshold voltage distribution width degradation rate; and
managing one or more parameters of the block based on the endurance estimate.

13. The method of claim 12, further comprising:
determining a range of threshold voltage distribution width degradation rates among the set of blocks;
dividing the range into multiple sub-ranges;
determining an endurance category for the block based on the threshold voltage distribution width degradation rate for the block corresponding to a sub-range associated with the endurance category, the endurance category indicating the estimated number of program/erase cycles during which the block is able to store data reliably.

14. The method of claim 13, wherein the managing of the one or more parameters of the block comprises maintaining the block in a static single level cell pool for a number of program/erase cycles based on the endurance estimate.

15. The method of claim 12, wherein:
the block is a first block;
the threshold voltage distribution width degradation rate is a first threshold voltage distribution width degradation rate; and
the determining of the endurance estimate is based on a comparison of the first threshold voltage distribution width degradation rate to a second threshold voltage distribution width degradation rate corresponding to a second block.

16. The method of claim 12, wherein the determining of the endurance estimate for the block comprises accessing look-up table to identify the endurance estimate using the set of threshold voltage distribution width measurements.

17. The method of claim 12, wherein determining the endurance estimate comprises assigning an endurance category to the block based on the set of threshold voltage distribution width measurements, the endurance category being associated with the endurance estimate.

18. The method of claim 12, wherein determining the endurance estimate comprises:
assigning the block to a group among multiple groups based on the threshold voltage distribution width measurements; and
assigning the group to an endurance category, the endurance category being associated with the endurance estimate.

19. The method of claim 12, wherein the obtaining of the set of threshold voltage distribution width measurements comprises:
measuring a first threshold voltage distribution width for the block based on a first number of program/erase cycles being performed on the block; and
measuring a second threshold voltage distribution width for the block based on a second number of program/erase cycles being performed on the block.

20. A non-transitory computer-readable storage medium comprising instructions that, when executed by a processing device, configure the processing device to perform operations comprising:
obtaining a set of threshold voltage distribution width measurements for a block in a memory device;
determining a threshold voltage distribution width degradation rate for the block based on the set of threshold voltage distribution width measurements for the block, the threshold voltage distribution width degradation rate for the block comprising a rate of change of threshold voltage distribution width;

determining an endurance estimate for the block based on the set of threshold voltage distribution width measurements, the determining of the endurance estimate comprising determining an estimated number of program/erase cycles during which the block is able to store data reliably based on the threshold voltage distribution width degradation rate; and managing one or more parameters of the block based on the endurance estimate.

\* \* \* \* \*